(12) United States Patent
Farbiz et al.

(10) Patent No.: US 11,720,734 B2
(45) Date of Patent: *Aug. 8, 2023

(54) SEMICONDUCTOR LAYOUT IN FINFET TECHNOLOGIES

(71) Applicant: Apple Inc., Cupertino, CA (US)

(72) Inventors: Farzan Farbiz, Mountain View, CA (US); Thomas Hoffmann, Los Gatos, CA (US); Xin Yi Zhang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/920,524

(22) Filed: Jul. 3, 2020

(65) Prior Publication Data
US 2020/0401752 A1    Dec. 24, 2020

Related U.S. Application Data

(63) Continuation of application No. 15/697,239, filed on Sep. 6, 2017, now Pat. No. 10,740,527.

(51) Int. Cl.
*G06F 30/392* (2020.01)
*H01L 27/118* (2006.01)
(Continued)

(52) U.S. Cl.
CPC ............ *G06F 30/392* (2020.01); *G06F 30/33* (2020.01); *G06F 30/39* (2020.01); *G06F 30/394* (2020.01);
(Continued)

(58) Field of Classification Search
CPC . G06F 1/16; G06F 30/33; G06F 30/39; G06F 30/392; G06F 30/394; G06F 1/10;
(Continued)

(56) References Cited

U.S. PATENT DOCUMENTS 6,373,109 B1    4/2002  Ahn
9,461,032 B1 *  10/2016 Edwards ............. H01L 29/0626
(Continued)

FOREIGN PATENT DOCUMENTS

CN    102754214 A    10/2012
CN    102779806 A    11/2012
(Continued)

OTHER PUBLICATIONS

International Search Report and Written Opinion in International Application No. PCT/US2018/040588, dated Sep. 12, 2018, 13 pages.

(Continued)

*Primary Examiner* — Binh C Tat
(74) *Attorney, Agent, or Firm* — Kowert Hood Munyon Rankin and Goetzel PC; Rory D. Rankin

(57) ABSTRACT

Systems, apparatuses, and methods for placing cells in an integrated circuit are described. In various embodiments, an integrated circuit is divided into many partitions. In a first set of partitions susceptible to transistor latch-up, the many transistor gate stripes are connected to one of the power rails rather than left floating. The lengths of the transistor gate stripes are shortened for well tap cells in the first partition, but increased in a second partition susceptible for poor signal integrity. One or more implant layers are formed underneath the transistor gate stripes in each of the first and second partitions to adjust an amount of protection against transistor latch-up and poor signal integrity. An electrostatic discharge transistor is included with at least one source region of multiple source regions formed in a well with a same doping polarity as the at least one source region.

14 Claims, 14 Drawing Sheets

(51) Int. Cl.
  *H01L 27/092* (2006.01)
  *H01L 29/78* (2006.01)
  *G06F 30/33* (2020.01)
  *G06F 30/39* (2020.01)
  *G06F 30/394* (2020.01)
  *H01L 27/02* (2006.01)

(52) U.S. Cl.
  CPC .... *H01L 27/0921* (2013.01); *H01L 27/11807* (2013.01); *H01L 29/785* (2013.01); *H01L 27/0251* (2013.01); *H01L 2027/1189* (2013.01)

(58) Field of Classification Search
  CPC .. G06F 30/396; G06F 2119/18; G06F 3/0383; G06F 3/04897; G06F 21/73; G06F 21/79; G06F 1/206; G06F 1/1616; G06F 1/1652; H01L 25/50; H01L 2225/06541; H01L 27/0688; H01L 27/092; H01L 2924/13091; H01L 27/0248; H01L 27/0207; H01L 23/49838; H01L 24/11; H01L 27/0251; H01L 23/5223; H01L 27/0924; H01L 21/823437; H01L 21/823431; H01L 21/823821; H01L 27/0886; H01L 27/0922; H01L 27/0292; H01L 29/66795; H01L 23/5226; H01L 27/098; H01L 2224/04042; H01L 2924/14; H01L 2224/73265; H01L 2224/119; H01L 2224/13082; H01L 2224/13083; H01L 2224/13084; H01L 2224/73215; H01L 27/085; H01L 27/1203; H01L 2224/45099; H01L 2224/1148; H01L 23/367; H01L 2924/0002; H01L 25/16; H01L 2224/05647; H01L 24/32; H01L 24/45; H01L 2224/05548; H01L 2224/92125; H01L 2224/92127; H01L 2224/92147; H01L 2224/92225; H01L 2224/92247; H01L 2224/94; H01L 24/13; H01L 24/14; H01L 24/16; H01L 27/105; H01L 27/11807; H01L 21/8249; H01L 2924/1305; H01L 21/3065; H01L 29/66659; H01L 2924/15311; H01L 2924/13055; H01L 2924/13034; H01L 29/0847; H01L 29/0878; H01L 21/823487; H01L 29/785; H01L 27/1211; H01L 29/775; H01L 29/41791; G06K 19/0726; G06K 19/0712; G06K 7/0008; G06K 19/0716
  USPC .................................. 716/100–108, 100–106
  See application file for complete search history.

(56) References Cited

U.S. PATENT DOCUMENTS

| | | |
|---|---|---|
| 9,530,768 B1 | 12/2016 | Kim |
| 9,627,529 B1 | 4/2017 | Tang et al. |
| 10,740,527 B2 * | 8/2020 | Farbiz ............... H01L 27/11807 |
| 2001/0039643 A1 | 11/2001 | Kuroda et al. |
| 2002/0026261 A1 | 2/2002 | Clark et al. |
| 2005/0151160 A1 * | 7/2005 | Salcedo ............... H01L 27/0262 |
| | | 257/362 |
| 2008/0012050 A1 | 1/2008 | Aoki et al. |
| 2011/0198677 A1 | 8/2011 | Carlson |
| 2012/0286341 A1 | 11/2012 | Chen et al. |
| 2014/0151809 A1 * | 6/2014 | Lin ..................... H01L 27/0629 |
| | | 257/355 |
| 2014/0175551 A1 * | 6/2014 | Lin ..................... H01L 27/0255 |
| | | 257/355 |
| 2014/0299920 A1 | 10/2014 | Nakanishi |
| 2015/0097542 A1 | 4/2015 | Repton et al. |
| 2015/0228649 A1 | 8/2015 | Singh et al. |
| 2015/0311142 A1 | 10/2015 | Sekar et al. |
| 2015/0318407 A1 | 11/2015 | Chen et al. |
| 2017/0194319 A1 | 7/2017 | Xu et al. |
| 2017/0236842 A1 | 8/2017 | Matsuda et al. |

FOREIGN PATENT DOCUMENTS

| | | |
|---|---|---|
| JP | H11274404 A | 10/1999 |
| JP | 2001351979 A | 12/2001 |
| JP | 2005354014 A | 12/2005 |
| KR | 20000065717 A | 11/2000 |
| KR | 20070069262 A | 7/2007 |
| KR | 20170096070 A | 8/2017 |
| TW | 201724454 A | 7/2017 |
| TW | 201729392 A | 8/2017 |
| WO | 2011106176 A | 9/2011 |

OTHER PUBLICATIONS

Office Action in Taiwanese Patent Application No. 107129273, dated Jan. 10, 2020, 16 pages.
First Examination Report in Indian Patent Application No. 202017005078, dated Apr. 26, 2021, 6 pages.
Office Action in Korean Patent Application No. 10-2020-7005704, dated Mar. 26, 2021, 10 pages.
Office Action in Korean Patent Application No. 10-2021-7015869, dated Aug. 31, 2021, 11 pages.
Notice of Allowance in Korean Patent Application No. 10-2020-7005704, dated Oct. 12, 2021, 3 pages.
Notice of Final Rejection in Korean Patent Application No. 10-2021-7015869, dated Mar. 30, 2022, 8 pages.
Notice of Allowance in Korean Patent Application No. 10-2021-7015869, dated Jun. 1, 2022, 3 pages.
Office Action in Taiwanese Patent Application No. 109140097, dated Apr. 11, 2022, 13 pages.
First Examination Report in Indian Patent Application No. 202118052395, dated May 6, 2022, 7 pages.

* cited by examiner

SEMICONDUCTOR LAYOUT IN FINFET TECHNOLOGIES

CROSS REFERENCE TO RELATED APPLICATIONS

This application is a continuation of U.S. patent application Ser. No. 15/697,239, entitled "SEMICONDUCTOR LAYOUT IN FINFET TECHNOLOGIES", filed Sep. 6, 2017, the entirety of which is incorporated herein by reference.

BACKGROUND

Technical Field

Embodiments described herein relate to the field of integrated circuits and, more particularly, to efficiently laying out cells in a floorplan for increasing reliability in an integrated circuit.

Description of the Related Art

Generally speaking, an integrated circuit includes a variety of components. Examples of components include a processing unit, a memory, an interface unit, one or more functional units, each for a specific purpose, bonding pads, drivers for driving signals between the bonding pads and other components, circuitry for selecting and driving values for a power supply and a ground reference, and so on. The various types of components are represented by shapes, such as rectangles, placed within a graphical representation of the partitioning of the die or package area used for the integrated circuit. This graphical representation is referred to as the floorplan.

The rectangles placed within the floorplan have geometric dimensions such as height and width. These dimensions have limits in order to place all of the components within the dimensions set for the floorplan. In addition to area consumed within the floorplan by placement of all of the components, area is additionally consumed by the routing of power lines and signals connected to the bonding pads along with the shielding and spacing used for these lines. Further, area within the floorplan is consumed by components, such as tap cells, used for preventing transistor latch-up and area is consumed by components, such as decoupling capacitors, used for improving signal integrity. Further still, area within the floorplan is consumed by cells for protecting against electrostatic discharge near the input/output (I/O) signals. Without expanding the dimensions of the floorplan, the area used for components is reduced. Therefore, the available performance of the integrated circuit is also reduced.

In view of the above, methods and mechanisms for laying out cells in a floorplan for increasing reliability in an integrated circuit are desired.

SUMMARY

Systems and methods for laying out cells in a floorplan for increasing reliability in an integrated circuit are contemplated. In various embodiments, a floorplan layout for an integrated circuit includes many regions. Designers and/or design tools determine a first set of regions of the multiple regions that are susceptible to transistor latch-up. In addition, designers and/or design tools determine a second set of regions of the multiple regions that are susceptible to relatively poor signal integrity. In a first set of regions susceptible to transistor latch-up, well tap cells that provide latch-up immunity are placed in these regions. These well tap cells have many high-dopant regions in a well and many transistor gate stripes on top of the well to satisfy design rules for the fabrication of Fin field effect transistors (FinFETs or just Finfets) in the integrated circuit. Each of the transistor gate stripes is placed between two high-dopant regions. In some embodiments, the transistor gate stripes are left floating.

In some embodiments, the well tap cells in the first region susceptible to transistor latch-up have the lengths of the transistor gate stripes shortened to provide more protection against transistor latch-up. In a second region susceptible to relatively poor signal integrity, the well tap cells have the lengths of the transistor gate stripes increased to provide more capacitance between power rails underneath the transistor gate stripes. In other embodiments, the well tap cells in the first region include an implant layer underneath each of the transistor gate stripes.

In some embodiments, in the second region susceptible to relatively poor signal integrity, the well tap cells include an implant layer underneath each of the transistor gate stripes. The implant layer is created with a dopant type different from a dopant type used for the well. In other embodiments, the modified well tap cells in the second region have an additional second implant layer underneath the first implant layer. The second implant layer is created with a same dopant type as a dopant type used for the well.

Further, in some embodiments, the floorplan layout for the integrated circuit includes an n-type electrostatic discharge (ESD) transistor. The ESD transistor is formed with two gate transistor gate stripes connected to a same gate terminal. In addition, the ESD transistor includes two drain regions between the two gate transistor gate stripes and the two drain regions are connected through contacts to a same drain terminal. Further, the ESD transistor includes multiple source regions, each connected through a contact to a same source terminal. In various embodiments, at least one source region is formed in a well with a same doping polarity as the at least one source region.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
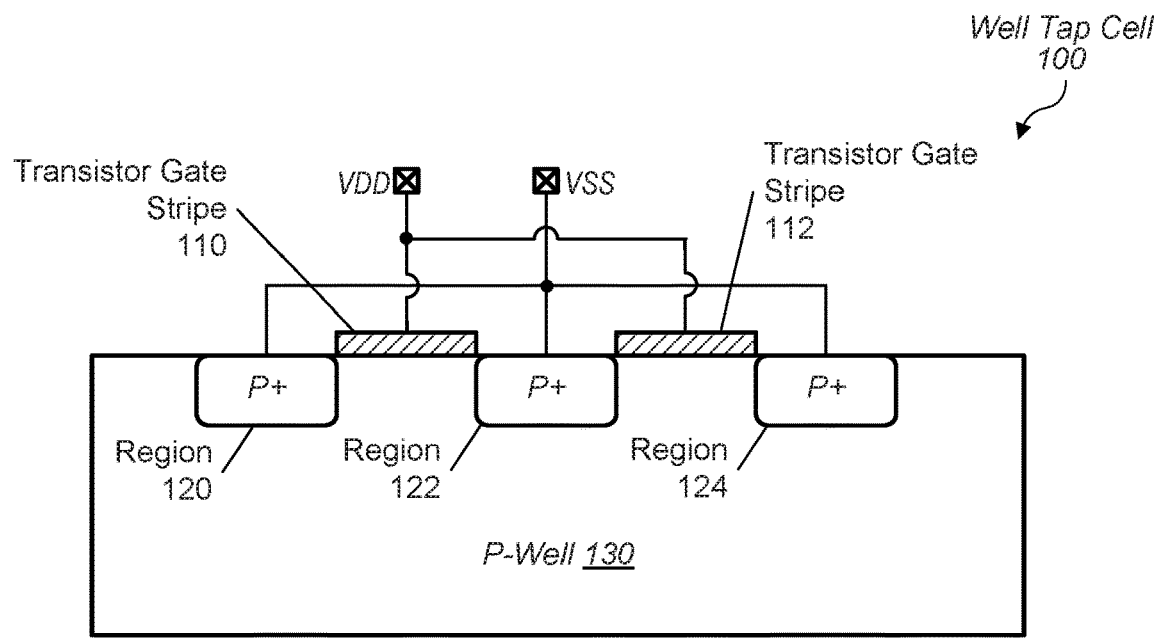
FIG. 1 is a block diagram of one embodiment of a cross section view of well tap cells.
Figure 1:
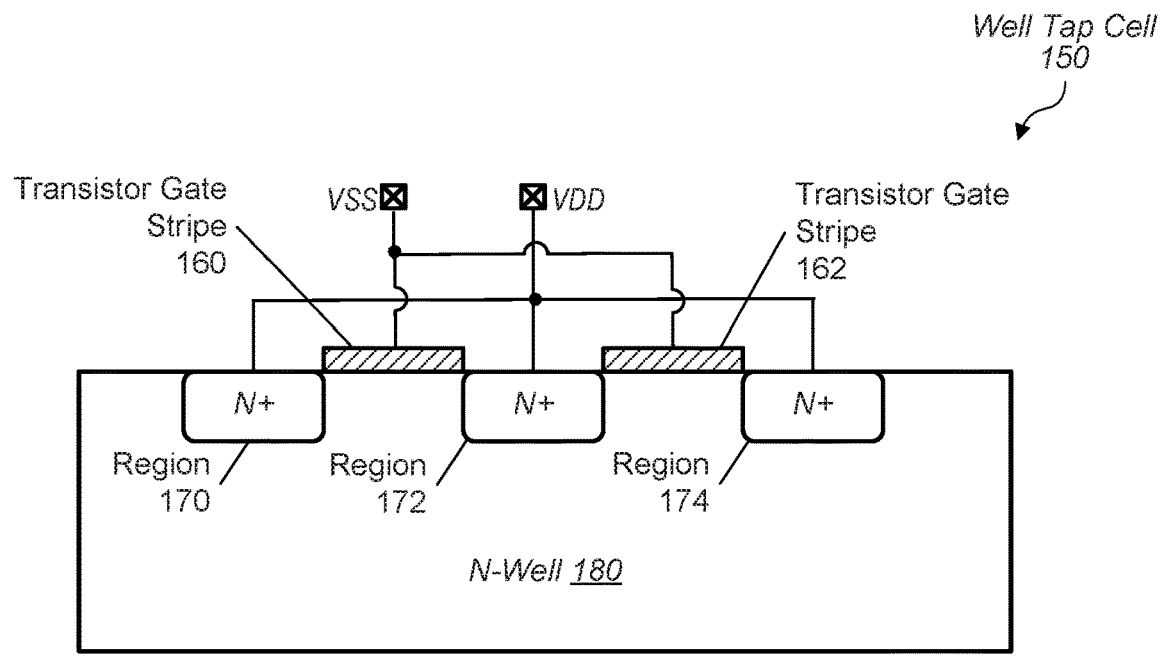

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Transistor latch-up is a condition that occurs when an unintended short circuit path is created during device operation and a relatively high amount of current flows between a power supply and a ground reference. Transistor latch-up is typically caused by a parasitic silicon controlled rectifier (SCR), which is also known as a thyristor. In the silicon substrate between an n-type field effect transistor (nfet) and a p-type FET (pfet), the thyristor may be inadvertently formed during device operation and behaves as a bipolar PNP transistor stacked on top of a bipolar NPN transistor. During a transistor latch-up event, each of the parasitic bipolar transistors maintains the other one in a conducting saturation operating region until a power down event. Voltage spikes, electrostatic discharge, an erroneous power-up sequence with multiple power supplies, and so on, may trigger a latch-up event.

In some designs, each of a substrate tap and a well tap is placed within a standard cell in a library of standard cells to increase design robustness by preventing transistor latch-up. For a p-type silicon substrate, in one example, a relatively high-doped p-type region is created next to the source and drain regions of an n-type field effect transistor (nfet). This relatively high-doped p-type region is a substrate tap. The substrate tap is connected to a ground reference and collects majority carriers in the p-type substrate, which reduces the bulk resistance, and accordingly, reduces the latch-up effect.

In a similar manner as described above, a relatively high-doped n-type region is created next to the source and drain regions of a p-type field effect transistor (pfet) within an n-well in the p-type substrate. This relatively high-doped n-type region within the n-well is a well tap. The well tap is connected to a power supply and collects majority carriers in the n-type n-well, which reduces the well resistance, and accordingly, reduces the latch-up effect. In other examples where the sizes of individual standard cells are reduced, the well tap is not placed within a standard cell, but placed in particular areas across the die of the integrated circuit. In the following discussion, modified well tap cells are described that can prevent transistor latch-up, additionally filter noise and further maintain signal integrity.

Turning now to FIG. 1, a generalized block diagram of one embodiment of a cross section view of each of a well tap cell 100 and a well tap cell 150 is shown. In the illustrated embodiment, well tap cell 100 includes an array of p-type regions 120, 122 and 124 in a p-well 130. In addition, multiple transistor gate stripes 110 and 112 are placed on top of p-well 130 between regions 120, 122 and 124. As shown, transistor gate stripe 110 is placed between p-type region 120 and p-type region 122. Additionally, transistor gate stripe 112 is placed between p-type region 122 and p-type region 124. In a similar manner, well tap cell 150 includes an array of n-type regions 170, 172 and 174 in an n-well 180 with transistor gate stripes 160 and 162 placed on top of n-well 180 between regions 170, 172 and 174. Although three regions and two transistor gate stripes are shown in each of p-well 130 and n-well 180 in the illustrated embodiment, any number of regions and transistor gate stripes may be used in other embodiments.

In various embodiments, each of the transistor gate stripes 110 and 112 includes multiple layers. For example, in an embodiment, an oxide layer, such as silicon dioxide, is placed on top of p-well 130. Additionally, in some embodiments, a silicon nitride layer is formed on top of the oxide layer to complete the insulating layer. Following, gate material is placed on top of the insulating layer. The transistor gate material includes one of polysilicon, titanium nitride (TiN) or other material. Each of the transistor gate stripes 160 and 162 is formed in a similar manner.

In various embodiments, each of well tap cell 100 and well tap cell 150 is an example of a cell of many cells placed across a die of an integrated circuit to prevent transistor latch-up and filter noise. The well tap cell 100 may be used in an n-type silicon substrate (not shown) and well tap cell 150 may be used in a p-type silicon substrate (not shown). In various embodiments, each of p-well 130 and p-type regions 120, 122 and 124 is formed by a doping step during a semiconductor fabrication process. The doping step adds impurities to the layers of silicon to change the electrical qualities of the silicon, which becomes either more electrically conductive or less based on the type of dopant added. Surface diffusion, ion implantation and a variety of other fabrication steps may be used to add the dopants to the silicon during a doping step.

When a p-type dopant, which includes acceptor atoms such as Boron atoms, is added to an n-type silicon substrate (not shown), the majority carriers in the silicon layers receiving the dopants are holes, and the silicon becomes more p-type in the region with the acceptor atoms. In one example, p-well 130 is created by such a process step. In a similar manner, a higher concentration of p-type dopants are added to the p-type regions 120, 122 and 124. Therefore, each of the p-type regions 120, 122 and 124 is more p-type than p-well 130, and the "+" in the illustrated embodiment indicates the higher doping with a p-type dopant. In a similar manner, each of the n-type regions 170, 172 and 174 is more n-type than n-well 180, and the "+" in the illustrated embodiment indicates the higher doping with an n-type dopant. In various embodiments, an n-type dopant includes donor atoms such as Phosphorous atoms. The majority carriers in the silicon layers receiving the donor atoms are electrons.

A p-type well, such as p-well 130, is typically used for creating an environment for fabricating n-type field effect transistors (nfets). Here, though, p-well 130 is used for creating well tap cell 100 to be used for preventing transistor latch-up and filtering noise. Similarly, an n-type well, such as n-well 180, is typically used for creating an environment for fabricating p-type field effect transistors (pfets). Here, though, n-well 180 is used for creating well tap cell 150 to be used for preventing transistor latch-up and filtering noise. Well tap cell 100 provides an electrically conductive path from the substrate (not shown) through p-well 130, through p-type regions 120, 122 and 124 and finally to the ground reference labeled as "VSS." Similarly, well tap cell 150 provides an electrically conductive path from the substrate (not shown) through n-well 180, through n-type regions 170, 172 and 174 and finally to the power supply labeled as "VDD." By coupling each of p-well 130 and n-well 180 to the ground reference and the power supply, respectively, the positive feedback of the latch-up effect is removed since the substrate resistance decreases.

In addition to removing the latch-up effect, connecting the p-type regions 120, 122 and 124 to the ground reference labeled as "VSS" removes a floating p-well 130, which removes a floating body connection for nfets (not shown) also using p-well 130. If p-well 130 was left floating, noise could affect the body potential for any nfets placed in p-well 130. Metal (not shown) is formed on each of the p-type regions 120, 122 and 124 in order to connect them to the ground reference. Similarly, connecting the n-type regions 170, 172 and 174 to the power supply labeled as "VDD" removes a floating n-well 180, which removes a floating body connection for pfets (not shown) also using n-well 180. If n-well 180 was left floating, noise could affect the body potential for any pfets placed in n-well 180. Metal (not shown) is formed on each of the n-type regions 170, 172 and 174 in order to connect them to the power supply.

The repeated transistor gate stripes 110 and 112 in well tap cell 100 are placed to satisfy density rules in the fabrication of the integrated circuit. For example, integrated circuits utilizing Fin field effect transistors (FinFETs or Finfets) satisfy the density requirement. Non-planar transistors which reduce short channel effects and allow for increased density are a relatively recent development in semiconductor processing, and FinFETs are an example of a non-planar transistor. Silicon Fins, which form the "Fin" of FinFETs with a relatively small pitch but with dimensions suitable for field effect transistors are formed by multiple processes such as extreme ultraviolet (EUV) lithography, directed self-assembly (DSA) patterning and sidewall image transfer (SIT) process.

Again, the repeated transistor gate stripes 110 and 112 in well tap cell 100 and the repeated transistor gate stripes 160 and 162 in well tap cell 150 are placed to satisfy density rules in the fabrication of the integrated circuit with Finfets as active devices. In the illustrated embodiment, the repeated transistor gate stripes 110 and 112 in well tap cell 100 are connected to the power supply labeled as "VDD." These connections create a decoupling capacitor effect since a capacitor is placed between the power rails VDD and VSS.

Typically, decoupling capacitors are created with two metal layers, such as metal4 (M4) and metal5 (M5) in one example, with an insulating layer between them and a connection from one metal layer to the power supply and a connection from the other metal layer to the ground reference. Here, the capacitor is between p-well 130 and the polysilicon, titanium nitride (TiN) or other material in the p-type stripes 110 and 112 with an insulating layer between p-well 130 and the conducting material in the stripes 110 and 112. The stripes 110 and 112 are connected to the power supply and p-well 130 is connected to the ground reference and there is an insulating layer between them. Thus, a decoupling capacitor effect is created. Accordingly, well tap cell 100 provides prevention of transistor latch-up, transistor noise immunity, and with the connections to the power supply through the stripes 110 and 112, well tap cell 100 also provides signal integrity with the decoupling capacitor effect. A similar decoupling capacitor effect is created in well tap cell 150 with the connections of the stripes 160 and 162 to the ground reference.

When the stripes 110 and 112 are connected to the power supply, a depletion region is formed underneath the stripes 110 and 112. Therefore, the ability to collect carriers from p-well 130 may decrease. Accordingly, well tap cell 100 provides expanded functionality, such as adding a decoupling capacitor effect to the tap cell functionality, but the tradeoff is the efficiency to provide each of the latch-up prevention, noise filtering and signal integrity effects may decrease. Similar characteristics occur for well tap cell 150. When regions across a floorplan of an integrated circuit do not need efficiency of a tap cell or of a decoupling capacitor above a given threshold, well tap cells 100 and 150 may be placed in these regions of the floorplan. Therefore, area is saved since these regions do not use both a tap cell and a separate decoupling capacitor. The saved area may be used for added functionality for the integrated circuit or more efficient signal routing.

Figure 2:
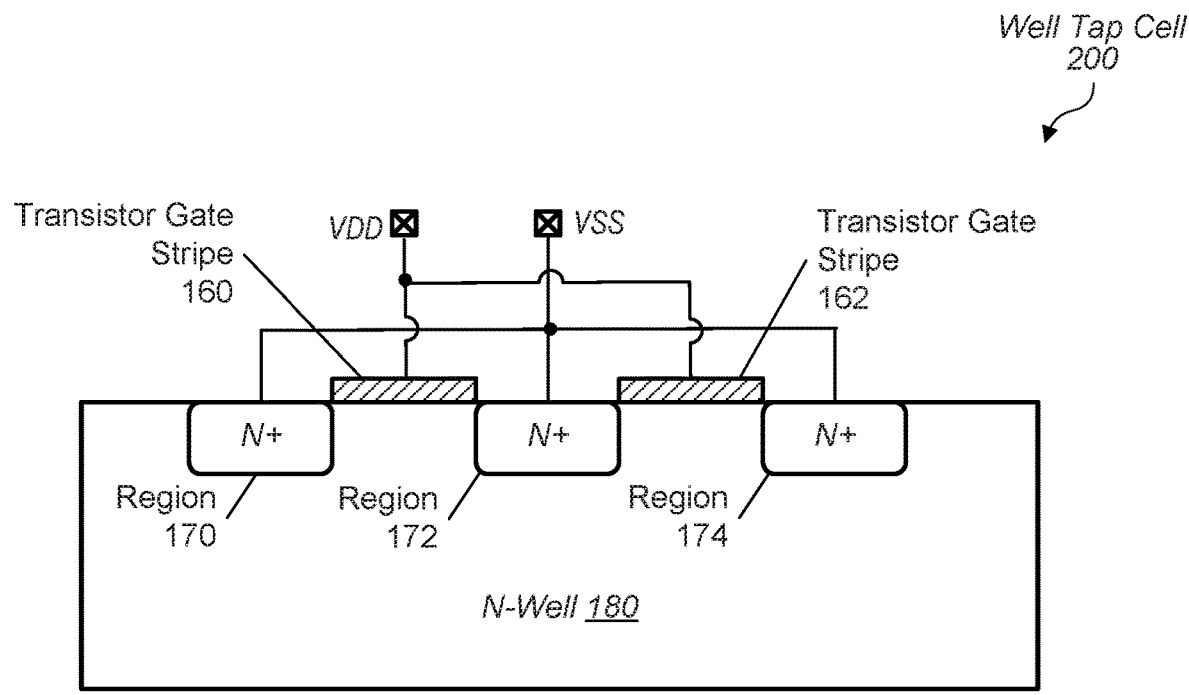
FIG. 2 is a block diagram of one embodiment of a cross section view of a well tap cell.

Turning now to FIG. 2, a generalized block diagram of one embodiment of a cross section view of each of a well tap cell 200 is shown. Materials and dopants described earlier are numbered identically for well tap cell 190. In some embodiments, well tap cell 190 is equivalent to well tap cell 150 previously shown in FIG. 1, except the power rails are switched. For well tap cell 190, each of the n-type regions 170, 172 and 174 is connected to the ground reference labeled as "VS S", rather than the power supply labeled as "VDD." Each of the transistor gate stripes 160 and 162 is connected to the power supply labeled as "VDD." The capacitance below each of the transistor gate stripes 160 and 162 increases from the capacitances achieved for the earlier well tap cell 150. For well tap cell 200, the power supply provides a positive charge on top of the transistor gate stripes 160 and 162, and n-well 180 provides the negative charge underneath the transistor gate stripes 160 and 162 while being connected to the ground reference through the n-type regions 170, 172 and 174. Therefore, the decoupling capacitor characteristics increase, or become more efficient for the same amount of area, but the tap cell characteristics decrease, or become less efficient for the same amount of area.

Figure 3:
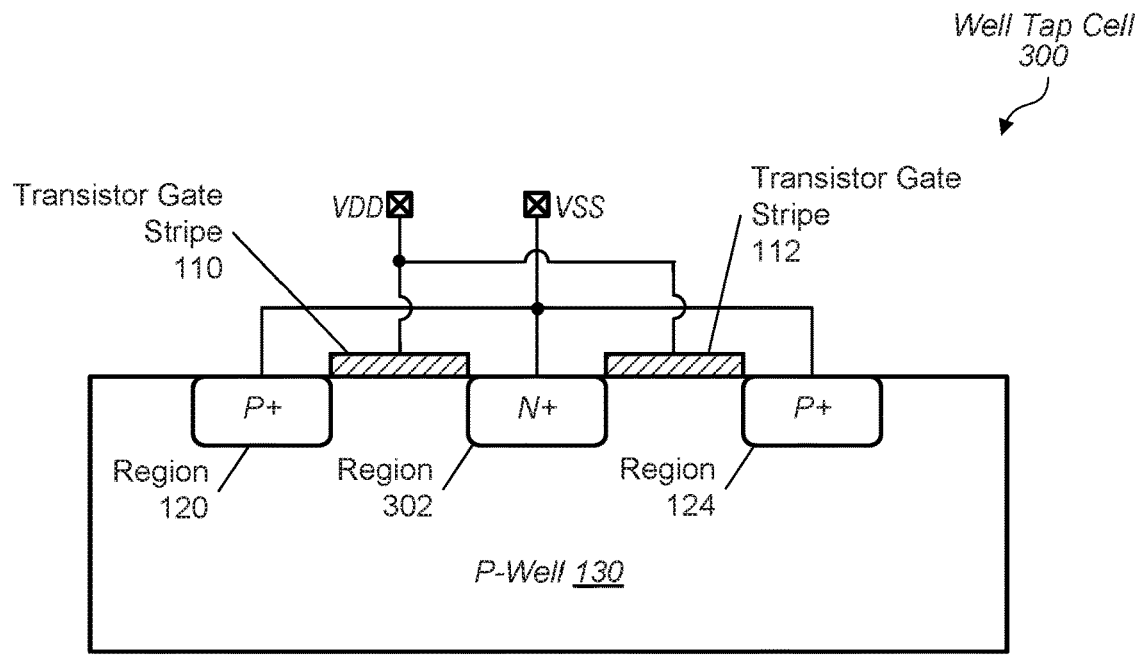
FIG. 3 is a block diagram of one embodiment of a cross section view of well tap cells.
Figure 3:
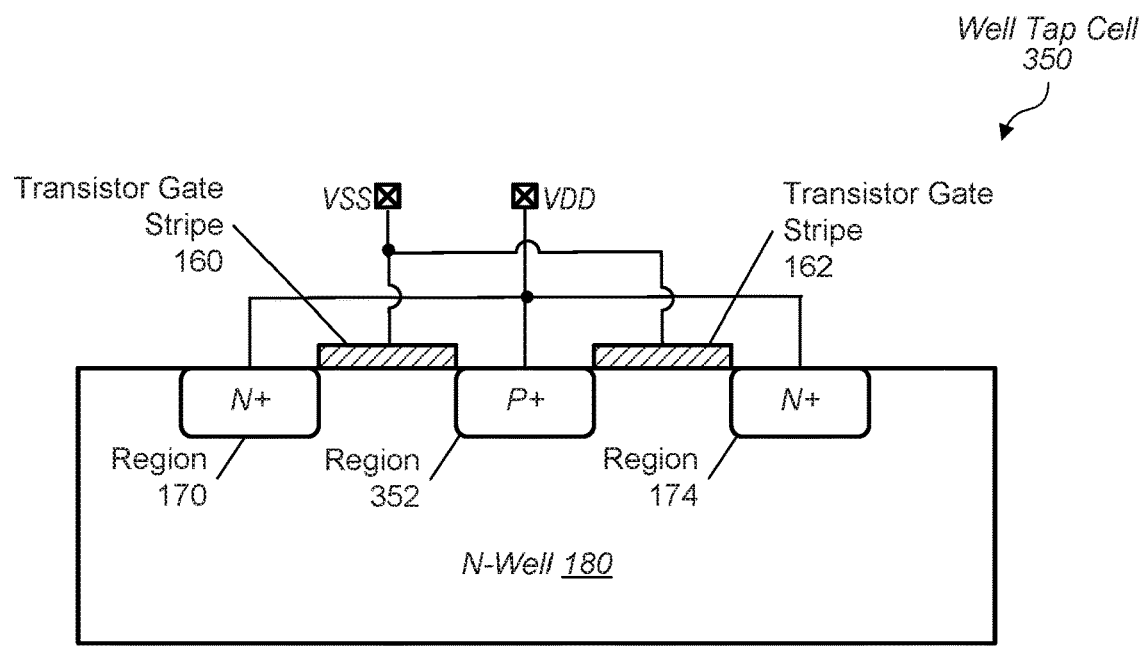

Turning now to FIG. 3, a generalized block diagram of one embodiment of a cross section view of each of a well tap cell 300 and a well tap cell 350 is shown. Materials and dopants described earlier are numbered identically for well tap cells 300 and 350. In the illustrated embodiment, well tap cell 300 includes an array of p-type region 120, n-type region 302 and p-type region 124 in p-well 130. Similarly, well tap cell 350 includes an array of n-type region 170, p-type region 352 and n-type region 174 in n-well 180. Therefore, one of the active high-dopant regions is replaced with a high-dopant region with an opposite polarity doping compared to a neighbor region. Although the single middle active high-dopant region is replaced in the illustrated embodiment, in other embodiments, another region is replaced and multiple regions may be replaced. Replacing one or more of the active high-dopant regions with an opposite polarity doping compared to a neighbor region increases the capacitance between power rails underneath the transistor gate stripes such as stripes 110 and 112 at higher operating frequencies.

Figure 4:
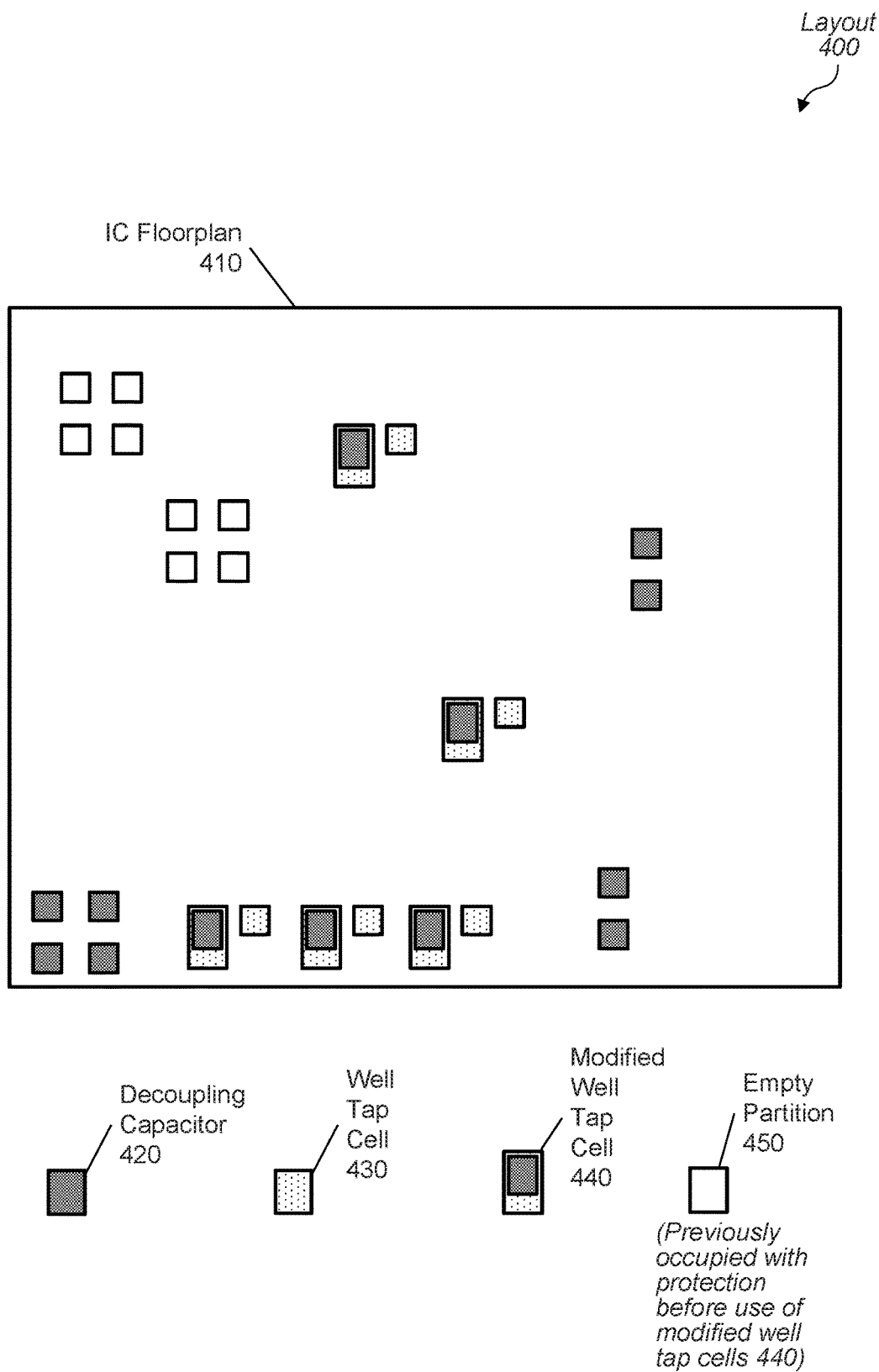
FIG. 4 is a block diagram of one embodiment of a layout floorplan for an integrated circuit.

Referring to FIG. 4, a generalized block diagram of one embodiment of layout 400 is shown. As shown, layout 400 includes an integrated circuit (IC) floorplan 410, which defines the height and width dimensions for the IC. The integrated circuit includes multiple components, each capable of processing and/or storing data. The multiple components include interface and functional blocks or units. In some embodiments, the multiple components are individual dies on one of a system on a chip (SOC), a multi-chip module (MCM) or a printed circuit board. Examples of components are general-purpose processors with one or more cores in a central processing unit (CPU), highly parallel data architected processors with one or more cores in graphics processing units (GPUs) and digital signal processors (DSPs), display controllers, audio processing components, networking components, peripheral interface controllers, memory controllers, and so on.

Interfaces, bonding pads and instantiated blocks providing the functionality of the above components are not shown for ease of illustration. The interfaces, bonding pads and instantiated blocks occupy the empty spaces in IC floorplan 410. In various embodiments, the instantiated blocks used in IC floorplan 410 include one or more standard library cells. One or more these standard cells do not utilize well tap cells, substrate tap cells or decoupling capacitors, which contributes to higher layout density while reducing robustness. The robustness is added with the placement of decoupling capacitors 420, well tap cells 430 and modified well tap cells 440.

In various embodiments, modified well tap cells 440 use the configuration and connections of one of well tap cell 100 and well tap cell 150 shown earlier in FIG. 1. Therefore, modified well tap cells 440 provide latch-up prevention and noise filtering as provided by well tap cells 430 and additionally provide signal integrity improvement as provided by decoupling capacitors 420 but in a less efficient manner for the same on-die area. However, regions (or partitions) in IC floorplan 410 that use modified well tap cells 440 save area since these partitions do not use both a well tap cell 430 and a separate decoupling capacitor 420. The saved area may be used for added functionality or more efficient signal routing in IC floorplan 410.

In an embodiment, well tap cells 430 use high-doped regions in a well, but they either do not include transistor gate stripes or maintain existing transistor gate stripes as floating. The decoupling capacitors 420 are two metal layers with an insulating layer between them and a connection from one metal layer to the power supply and a connection from the other metal layer to the ground reference. In various embodiments, a place and route tool uses an algorithm with a design rule checker to determine where to place each of the decoupling capacitors 420, well tap cells 430 and modified well tap cells 440 in IC floorplan 410.

For partitions where the probability for signal integrity issues is above a high threshold, the algorithm may select decoupling capacitors 420 for placement. For regions where signal integrity has the probability for signal integrity issues below the high threshold, but above a low threshold, the algorithm may select modified well tap cells 440 for placement since both signal integrity as well as latch-up prevention are obtained. For partitions where signal integrity has the probability for signal integrity issues below the low threshold and probability for transistor latch-up above a given threshold, the algorithm may select well tap cells 430 for placement.

In some embodiments, the algorithm is used in a reiterative manner. When it is determined regions in IC floorplan 410 use the modified well tap cells 440, area is saved, which may create empty partitions 450 in IC floorplan 410. As described earlier, the empty partitions 450 may be used added functionality or more efficient signal routing in IC floorplan 410.

Figure 5:
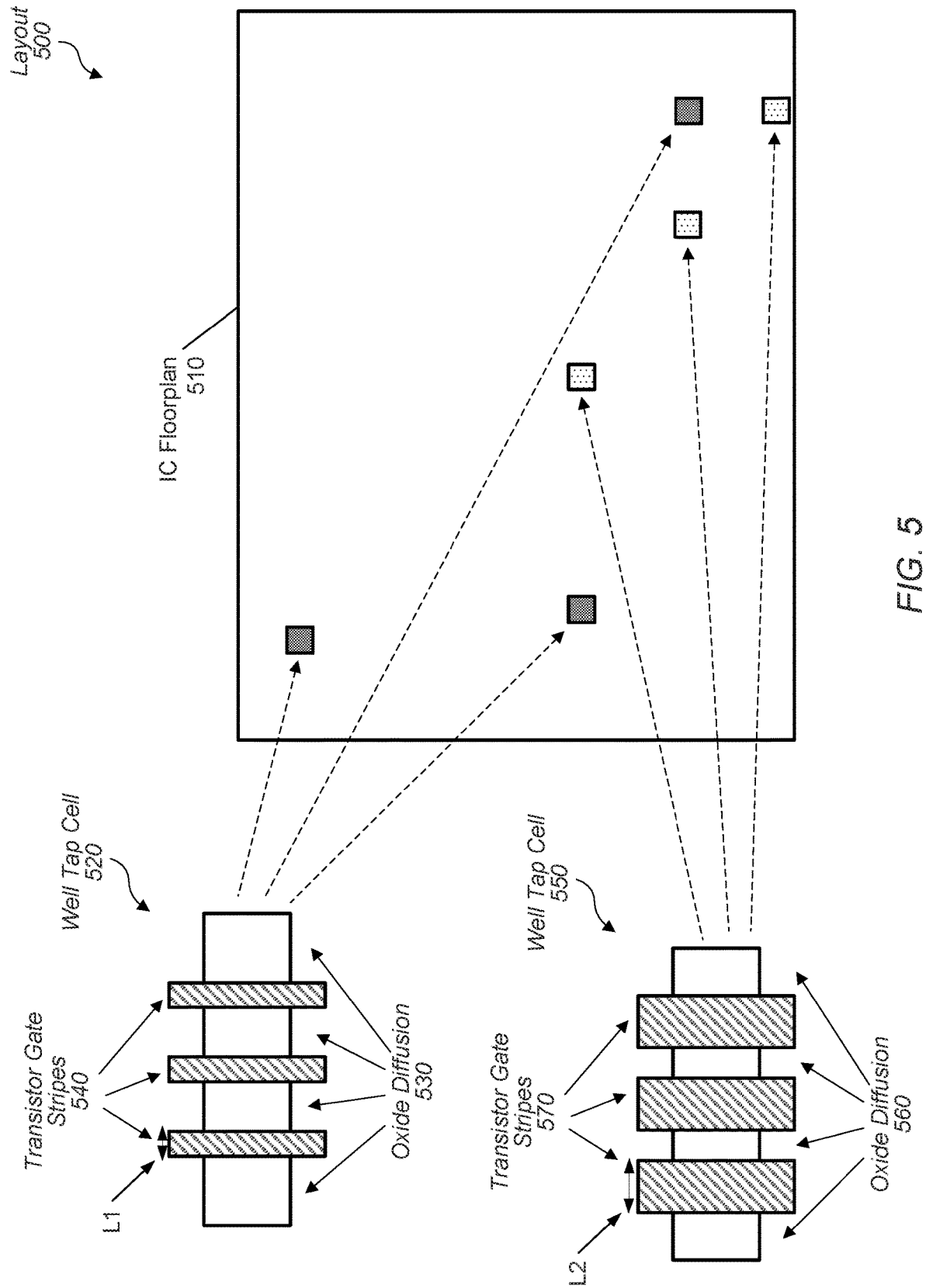
FIG. 5 is a block diagram of one embodiment of a layout floorplan for an integrated circuit.

Turning now to FIG. 5, a generalized block diagram of another embodiment of layout 500 is shown. As shown, layout 500 includes an integrated circuit (IC) floorplan 510, which defines the height and width dimensions for the IC. Additionally, the top views of the layout for well tap cells 520 and 550 are shown. Well tap cells 520 and 550 are placed across IC floorplan 510. As shown, the transistor gate stripes 540 in well tap cell 520 have a smaller length, which is indicated as "L1," than the length of the transistor gate stripes 570 in well tap cell 550, which is indicated as "L2."

As described earlier, the integrated circuit includes multiple components, each capable of processing and/or storing data. Interfaces, bonding pads and instantiated blocks providing the functionality of the above components are not shown for ease of illustration. Well tap cells are placed across IC floorplan 510 to prevent transistor latch-up and filter noise. Decoupling capacitors are placed across IC floorplan 510 to improve signal integrity. Also described earlier, modified well tap cells provide latch-up prevention and noise filtering as provided by well tap cells and additionally provide signal integrity improvement as provided by decoupling capacitors but in a less efficient manner for the same on-die area. However, regions that use modified well tap cells save area since these regions do not use both a well tap cell and a separate decoupling capacitor. The saved area may be used for added functionality or more efficient signal routing in IC floorplan 510.

In some embodiments, well tap cells 520 and 550 may be used as modified well tap cells for providing latch-up prevention, noise filtering and additionally signal integrity improvement. As shown, the top views of the layouts for well tap cells 520 and 550 include oxide diffusion 530 and 560, respectively. The oxide diffusion 530 and 560 define areas used for n-type regions (N+) in an n-well and p-type regions (P+) in a p-well. The transistor gate stripes 540 and 570 are similar to the transistor gate stripes described earlier. The respective lengths L1 and L2 of the transistor gate stripes 540 and 570 are used to balance the trade-off between latch-up immunity and signal integrity. For example, for the same layout area, the smaller length L1 creates a smaller depletion region, larger n-type or p-type regions in the well, and smaller resistive well connection. In contrast, the larger length L2 creates a larger depletion region, smaller n-type or p-type regions in the well, and larger resistive well connection. Therefore, well tap cell 520 is selected for latch-up immunity and noise filtering with a smaller signal integrity improvement, whereas well tap cell 550 is selected for signal integrity improvement with smaller latch-up immunity.

Designers may select a variety of factors for defining a particular region to be considered risky for transistor latch-up. Examples of factors include at least input/output circuitry, circuitry using a power-up sequence with multiple power supplies, circuitry with relatively long signal line lengths, and so forth. For regions in IC floorplan 510 identified by designers or a place and route tool with conditions for transistor latch-up concern, well tap cell 520 may be selected, and further, a decision is made whether the transistor gate stripes 540 are connected to a power rail or remain floating. For example, if little or no signal integrity improvement is needed, then the decoupling capacitor characteristic is not needed, and the transistor gate stripes 540 may remain floating. However, if some signal integrity improvement is needed, then the decoupling capacitor characteristic is needed, and the transistor gate stripes 540 may be connected to the ground reference when well tap cell 520 uses a p-well and the transistor gate stripes 540 may be connected to the power supply when well tap cell 520 uses an n-well.

Designers may select a variety of factors for defining a particular region to be considered risky for signal integrity problems. Examples of factors include at least relatively wide buses, relatively long signal line lengths, electromagnetic interference, relatively high operating frequencies, and so forth. For regions in IC floorplan 510 identified by designers or a place and route tool with conditions for signal integrity concern, well tap cell 550 may be selected, and further, a decision is made whether the transistor gate stripes 570 are connected to a power rail or remain floating. For example, the capacitance provided by the transistor gate stripes 270 increases when the stripes 570 are connected to a power rail. The transistor gate stripes 570 may be connected to the ground reference when well tap cell 550 uses a p-well and the transistor gate stripes 570 may be connected to the power supply when well tap cell 550 uses an n-well.

Figure 6:
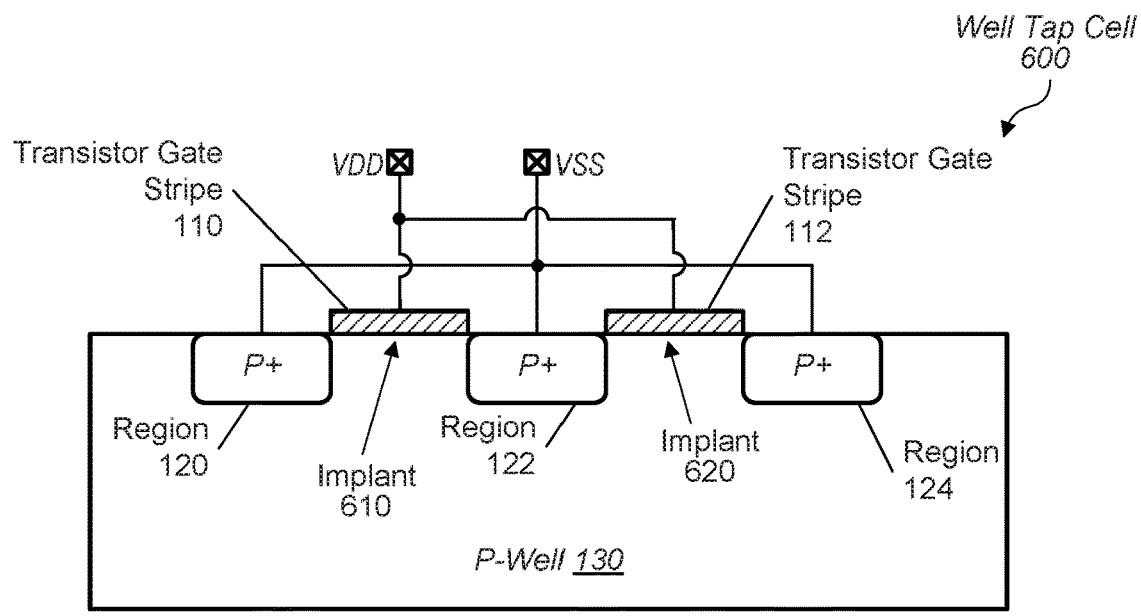
FIG. 6 is a block diagram of one embodiment of a cross section view of well tap cells.
Figure 6:
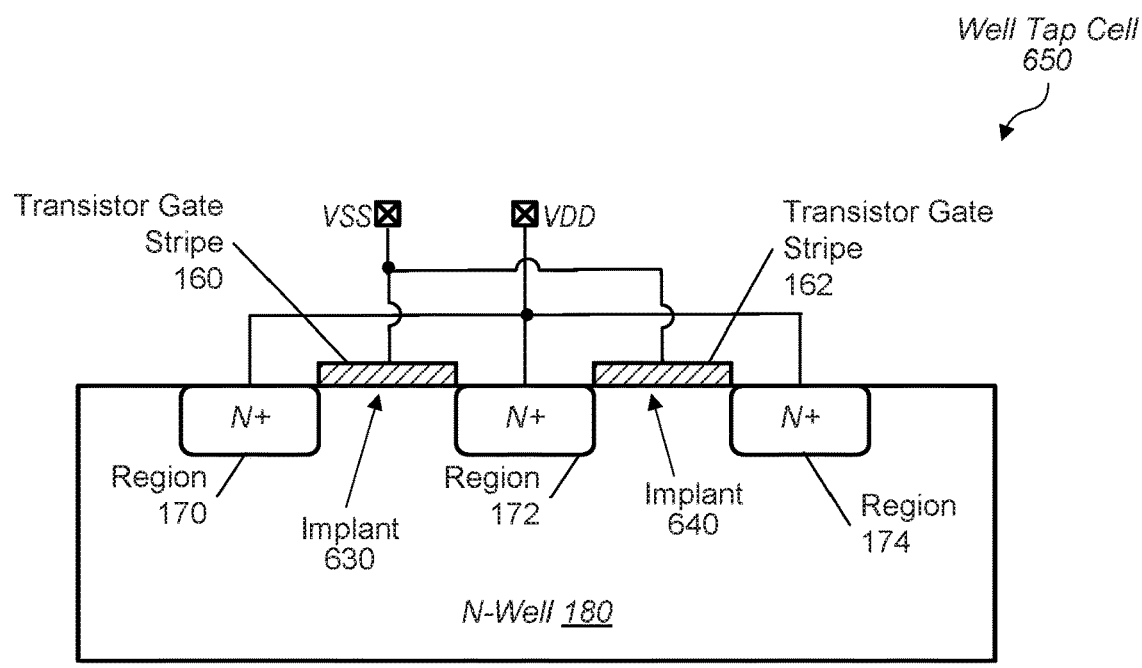

Referring to FIG. 6, a generalized block diagram of one embodiment of a cross section view of each of a well tap cell 600 and a well tap cell 650 is shown. Materials and regions described earlier are numbered identically. As shown, well tap cell 600 includes an implant 610 under transistor gate stripe 110 and implant 620 under transistor gate stripe 112. Surface diffusion, ion implantation and a variety of other fabrication steps may be used to add implants 610 and 620 to p-well 130. If a p-type dopant is used for implants 610 and 620, then the tap cell characteristic increases such as collecting carriers from p-well 130 into the p-type regions 120, 122 and 124. However, the decoupling capacitor characteristic decreases such as the amount of capacitance achieved between the power supply and the ground reference.

If an n-type dopant is used for implants 610 and 620, then the decoupling capacitor characteristic increases such as the amount of capacitance achieved between the power supply and the ground reference. However, the tap cell characteristic decreases such as collecting carriers from p-well 130 into the p-type regions 120, 122 and 124. Similar results as described above are achieved for well tap cell 650. If an n-type dopant is used for implants 630 and 640, then the tap cell characteristics increase as decoupling capacitor characteristics decrease. In contrast, if a p-type dopant is used for implants 630 and 640, then the decoupling capacitor characteristics increase as the tap cell characteristics decrease.

In addition to adding implants to adjust the trade-off between tap cell characteristics and decoupling capacitor characteristics, the transistor gate work function is changed. The work function corresponds to the minimum amount of energy needed to remove an electron from the material. The work function of a material is the difference between the vacuum energy level and the Fermi energy level of the material. Transistors formed with an n-channel and a gate material using Molybdenum (Mo), for example, have a work function near 5 electron-volts (eV). The transistor gate work function dependence of the transistor threshold voltage is a relatively linear relation. For example, the threshold voltage for n-channel (n-type) Finfets increases with increasing transistor gate work function. Again, as the work function increases, the amount of energy needed to remove an electron from the transistor gate material increases, so the channel is less n-type until the transistor gate voltage exceeds a higher threshold. In contrast, as the transistor gate work function increases for p-channel (p-type) Finfets, the channel is less n-type, which permits the threshold voltage to be a less negative value. Therefore, the threshold voltage decreases.

In some embodiments, the work function is changed for transistor gate stripes 110 and 112 in the well tap cell 600 and for transistor gate stripes 160 and 162 in the well tap cell 650. For example, if the work function for the transistor gate stripes 110 and 112 is increased, the effect is similar to using p-type dopants for implants 610 and 620, and the tap cell characteristics increase. However, if the work function for the transistor gate stripes 110 and 112 is decreased, the effect is similar to using n-type dopants for implants 610 and 620, and the decoupling capacitor characteristic increases. Similar results as described above are achieved for well tap cell 650. If the work function for the transistor gate stripes 160 and 162 is increased, the effect is similar to using p-type dopants for implants 630 and 640, and the decoupling capacitor characteristics increase. However, if the work function for the transistor gate stripes 160 and 162 is decreased, the effect is similar to using n-type dopants for implants 630 and 640, and the tap cell characteristics increase. In some embodiments, a combination of adding implants and adjusting the work function is performed to adjust the tap cell characteristics and the decoupling capacitor characteristics of one or more of the well tap cells 600 and 650.

Figure 7:
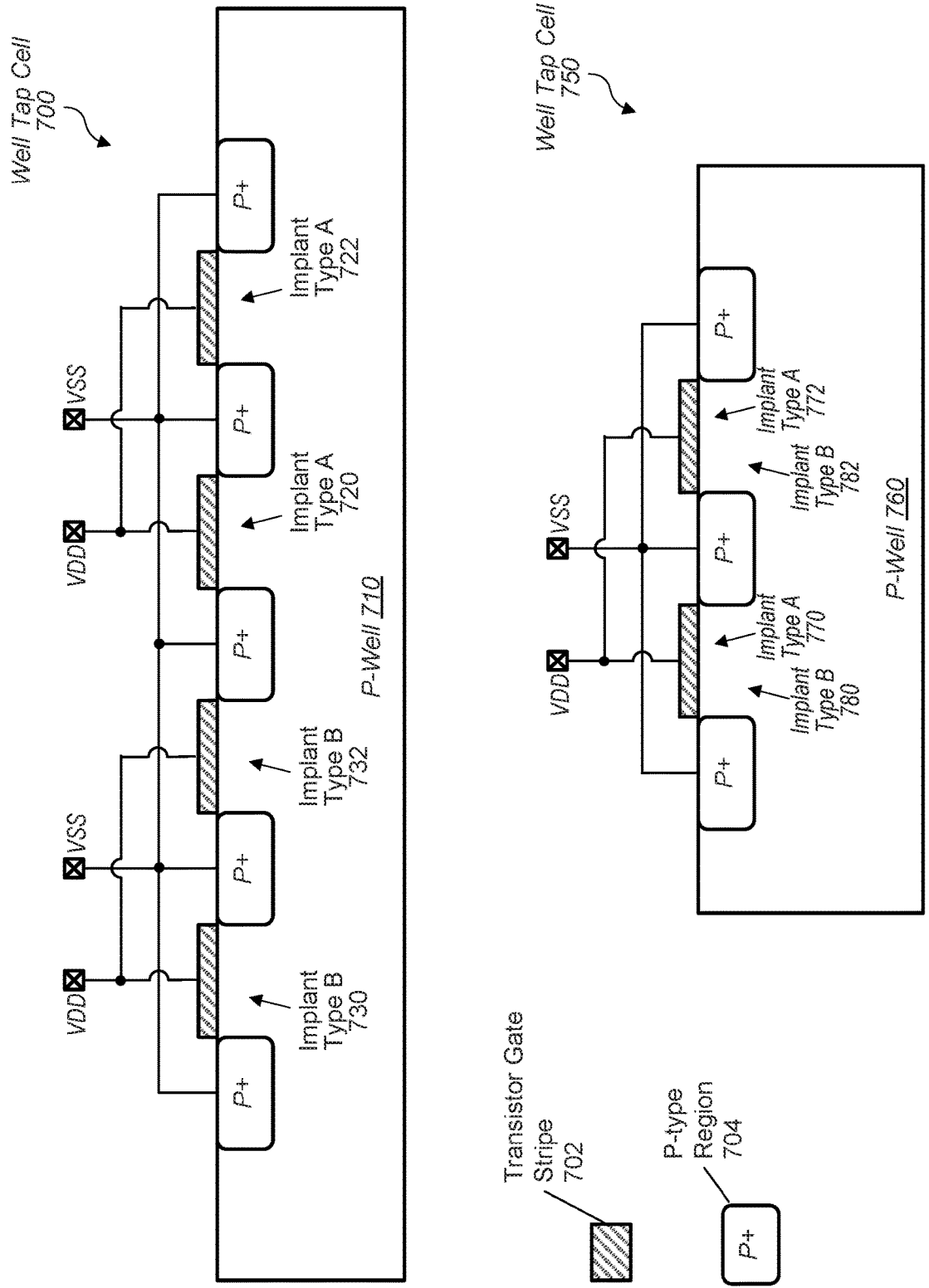
FIG. 7 is a block diagram of one embodiment of a cross section view of well tap cells.

Referring to FIG. 7, a generalized block diagram of one embodiment of a cross section view of each of a well tap cell 700 and a well tap cell 760 is shown. Each of the well tap cells 700 and 760 include transistor gate stripes 702 and p-type regions 704 as described earlier. Additionally, each of the well tap cells 700 and 760 include implants to adjust the tap cell characteristics and decoupling capacitor characteristics. As shown, well tap cell 700 includes two well taps abutted next to each other, each with a different types of implant. As shown, well tap cell 700 includes implant type A 720 and implant type A 722, and additionally, implant type B 730 and implant type B 732. Although two different types of implants are shown, in other embodiments, another number of different implants is used.

In some embodiments, each of implant type A 720 and implant type A 722 is used to increase the tap cell characteristics while decreasing the decoupling capacitor characteristics. For example, as described earlier for well tap cell 700 in FIG. 7, a p-type dopant is used in a p-well to increase the tap cell characteristics (or increase the tap cell efficiency for a same amount of on-die area), which includes collecting carriers from p-well 710 into the p-type regions 704. Additionally, in some embodiments, each of implant type B 730 and implant type B 732 is used to increase the decoupling capacitor characteristics while decreasing the tap cell characteristics of the abutting well tap cell. For example, as described earlier, an n-type dopant is used in a p-well to increase the decoupling capacitor characteristics (or increase the decoupling capacitor efficiency for a same amount of on-die area). In other embodiments, the doping of the implants 720-732 are changed to reverse the characteristics. Therefore, the adjustments of the characteristics may be done within a same structure using abutting well tap cells to fine-tune characteristics within a region or at adjoining edges of regions.

In the illustrated embodiment, well tap cell 760 includes each of implant type A 770 and implant type B 780 under a same transistor gate stripe 704. Additionally, well tap cell 760 includes each of implant type A 772 and implant type B 782 under a same transistor gate stripe. In some embodiments, each of implant type A 770 and implant type A 772 is used to adjust the decoupling capacitor characteristics of well tap cell 760, while each of implant type B 780 and implant type B 782 is used to adjust the tap cell characteristics of well tap cell 760.

Each of implant type B 780 and implant type B 782 is placed below each of implant type A 770 and implant type A 772 in p-well 760. Therefore, different doping depths are used for each of implant type A 770 and implant type B 780 under the same transistor gate stripe 704 as well as for each of implant type A 772 and implant type B 782 under the same transistor gate stripe 704. Although variations of well tap cells using an n-well are not shown, in other embodiments, well tap cells with an n-well are placed in a floorplan layout using the techniques demonstrated for well tap cells 700 and 760. For example, well tap cells with an n-well and implants may be used either as abutting well tap cells and/or with multiple implants under the transistor gate stripes. Similar to adjustments for well tap cells 600 and 650, in some embodiments, a combination of adding implants and adjusting the work function is performed to adjust the tap cell characteristics and the decoupling capacitor characteristics of one or more of the well tap cells 700 and 760.

Figure 8:
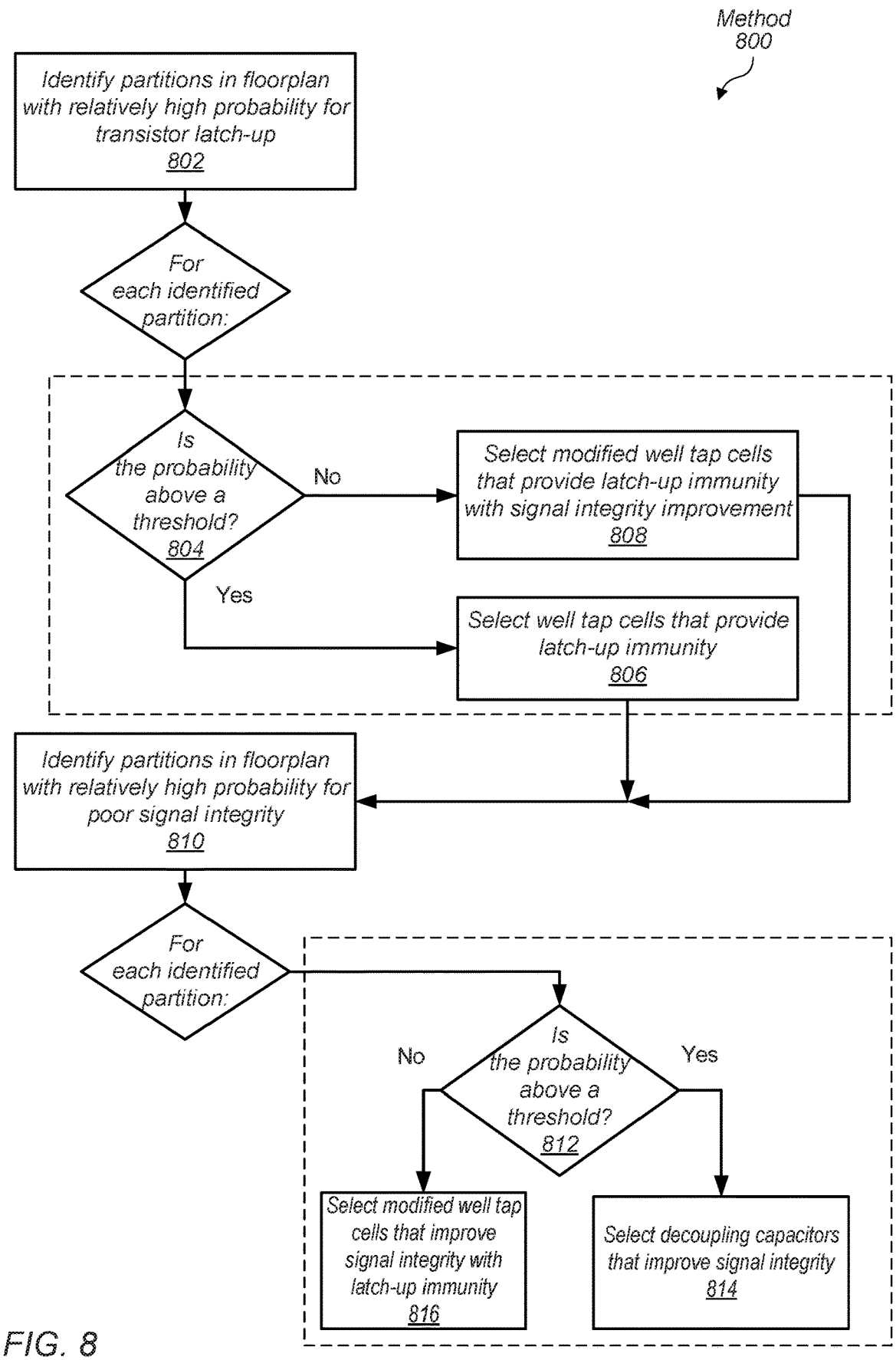
FIG. 8 is a flow diagram of one embodiment of a method for efficiently changing both tap cell characteristics and decoupling characteristics of floorplan partitions.

Referring now to FIG. 8, a generalized flow diagram of one embodiment of a method 800 for efficiently changing both tap cell characteristics and decoupling characteristics of floorplan partitions is shown. For purposes of discussion, the steps in this embodiment are shown in sequential order (likewise for FIG. 14). However, in other embodiments some steps may occur in a different order than shown, some steps may be performed concurrently, some steps may be combined with other steps, and some steps may be absent.

A floorplan for an integrated circuit includes multiple partitions. Designers and/or an algorithm within design tools determine which of a variety of factors that cause transistor latch-up and poor signal integrity are selected and used to identify partitions susceptible to transistor latch-up and susceptible to relatively poor signal integrity. In some embodiments, a formula is used to compute a value to compare to one or more thresholds to identify the susceptible partitions.

Partitions are identified in the floorplan with relatively high probability for transistor latch-up (block 802). For each of the identified partitions, if the probability is above a threshold ("yes" branch of the conditional block 804), then well tap cells that provide latch-up immunity are selected for placement in the partition (block 806). In various embodiments, these well tap cells have many high-dopant regions in a well and many transistor gate stripes on top of the well to satisfy design rules for the fabrication of Finfets in the integrated circuit. Each of the transistor gate stripes is placed between two high-dopant regions. In some embodiments, the transistor gate stripes are left floating.

For each of the identified partitions, if the probability is not above a threshold ("no" branch of the conditional block 804), then modified well tap cells that provide latch-up immunity with signal integrity improvement are selected for placement in the partition (block 808). In some embodiments, the modified well tap cells have the many transistor gate stripes connected to one of the power rails rather than left floating. The lengths of the transistor gate stripes may also be shortened to increase the protection against transistor latch-up while still providing capacitance between power rails underneath the transistor gate stripes. In other embodiments, one or more implant layers are formed underneath the transistor gate stripes to adjust an amount of protection against transistor latch-up while still providing capacitance between power rails underneath the transistor gate stripes. The doping of the implant layers may be performed as described earlier in each of FIG. 6 and FIG. 7.

Partitions are identified in the floorplan with relatively high probability for poor signal integrity (block 810). For each of the identified partitions, if the probability is above a threshold ("yes" branch of the conditional block 812), then decoupling capacitors that improve signal integrity are selected for placement in the partition (block 814). Otherwise, if the probability is not above a threshold ("no" branch of the conditional block 812), then modified well tap cells that improve signal integrity with latch-up immunity are selected for placement in the partition (block 816).

In some embodiments, the modified well tap cells have the many transistor gate stripes connected to one of the power rails rather than left floating. The lengths of the transistor gate stripes may also be increased to increase the capacitance between power rails underneath the transistor gate stripes. In other embodiments, one or more of the active high-dopant regions are replaced with an opposite polarity doping compared to a neighbor region, which increases the capacitance between power rails underneath the transistor gate stripes at higher operating frequencies. In yet other embodiments, one or more implant layers are formed underneath the transistor gate stripes to adjust an amount of capacitance underneath the transistor gate stripes while still providing protection against transistor latch-up. The doping of the implant layers may be performed as described earlier in each of FIG. 6 and FIG. 7.

Figure 9:
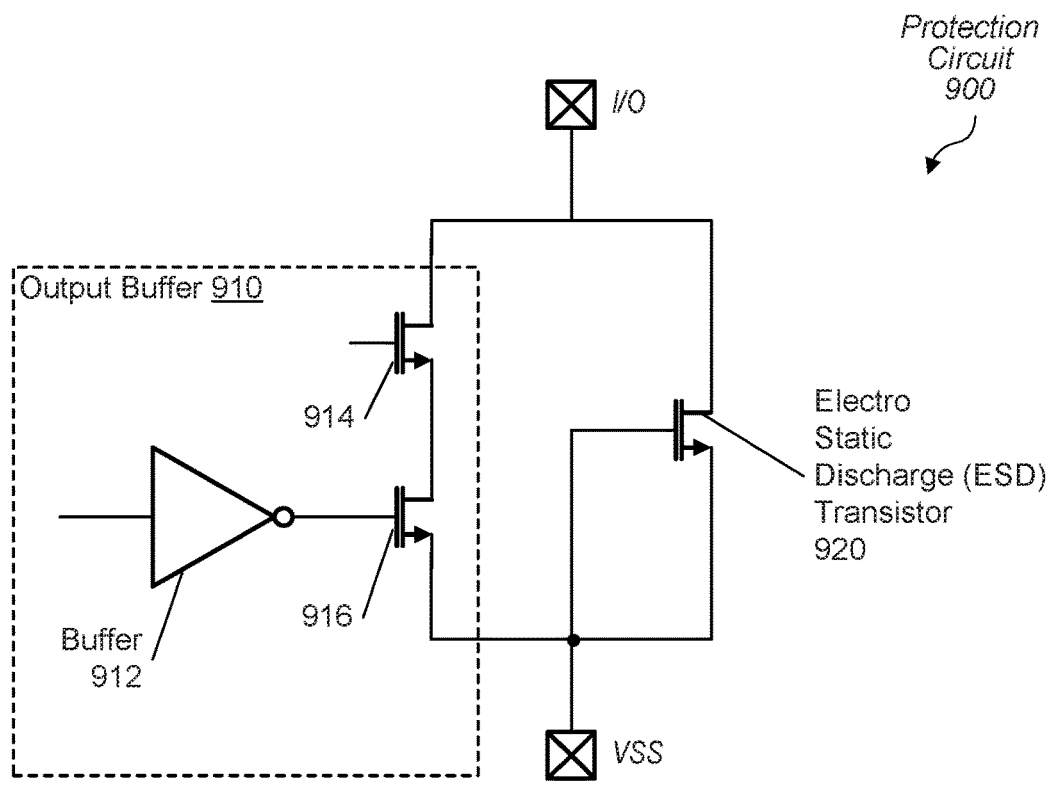
FIG. 9 is a block diagram of one embodiment of a cross section view of a protection circuit and a top view of layout for the protection circuit.
Figure 9:
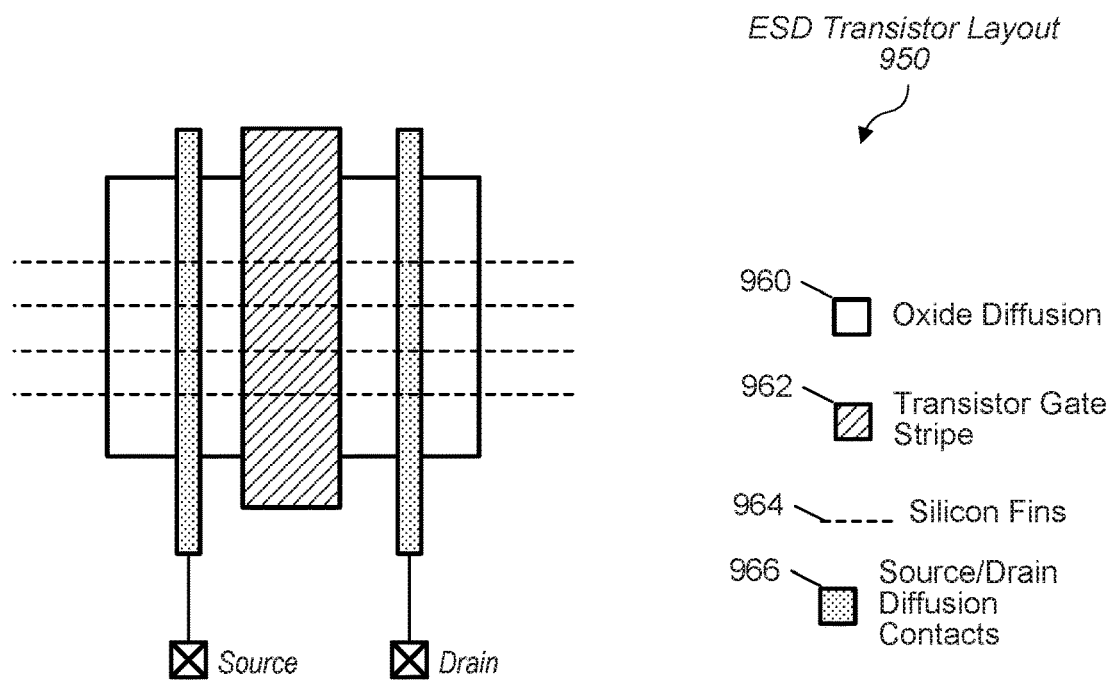

Referring to FIG. 9, a generalized block diagram of one embodiment of a protection circuit 900 and a top view of layout 960 for the protection circuit is shown. In the illustrated embodiment, output buffer 910 includes a buffer 912, such as one or more inverters in series, and the nfet 916 connected to the input/output (I/O) pin through one or more nfets such as nfet 914. The I/O pin is also connected to an electro static discharge (ESD) transistor 920. In the illustrated embodiment, ESD transistor 920 is connected in a grounded-gate configuration for ESD protection of fail-safe topologies. As shown, the drain terminal of ESD transistor 920 is connected to the I/O pin and the source terminal is connected to the source terminal of nfet 916. The gate terminal of ESD transistor 920 is connected to the ground reference labeled as "VSS."

In various embodiments, ESD transistor 920 is appreciably larger than devices used in buffer 912 and nfets 914 and 916. The size of ESD transistor 920 may depend on an estimated amount of current needed to flow through ESD transistor 920 when conducting during an ESD event. In some embodiments, ESD transistor 920 is an nfet. The appreciably large size of ESD transistor 920 consumes an appreciable amount of on-die area in addition to an appreciable amount of static leakage current may drain the battery of a mobile device. Further, the parasitic components of the appreciably large ESD transistor 920 reduces switching capability, and thus, performance on I/O signals.

Layout 960 is a top view of one example of semiconductor layout for ESD transistor 920. As shown, source and drain diffusion contacts 966 are on either side of the transistor gate stripe 962. In some embodiments, the source and drain diffusion contacts 966 are trench silicide contacts providing relatively low resistive contacts for the regions. As described earlier, the transistor gate stripe 962 includes one of polysilicon, titanium nitride (TiN) or other material. Each of the source and drain diffusion contacts 966 is formed on top of the oxide diffusion (OD) 960. The OD 960 are n-type or p-type diffusion, which defines areas used for n-type regions (N+) in an n-well and p-type regions (P+) in a p-well. In various embodiments, ESD transistor 920 is a non-planar transistor such as a Fin field effect transistor (Finfet). The silicon Fins 964 are formed over each of the other materials 960, 962 and 966.

As shown, ESD transistor 920 has each of the gate terminal and source terminal connected to the ground reference. Therefore, ESD transistor 920 does not turn on, but ESD transistor 920 still conducts current such as during an ESD event. During an ESD event, the parasitic bipolar NPN transistor within ESD transistor 920 turns on and conducts current to remove excessive charge from an inadvertent voltage spike. Adjusting the characteristics of the parasitic bipolar NPN transistor within ESD transistor 920 allows ESD transistor 920 to conduct an appreciable amount of current with less of the area cost and parasitic effects diminishing performance. Further details are provided next.

Figure 10:
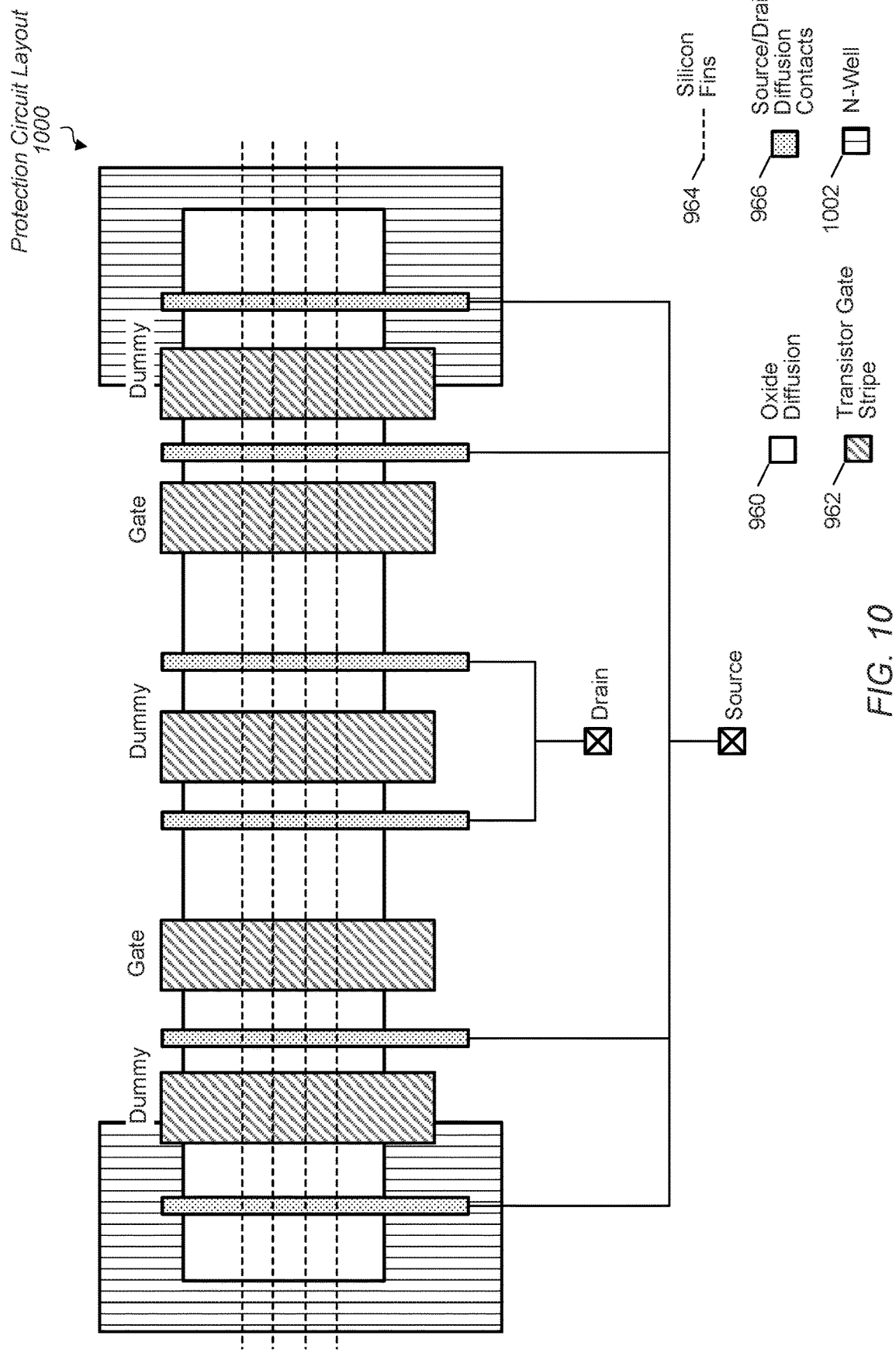
FIG. 10 is a block diagram of one embodiment of a top view of layout for a protection circuit.

Turning now to FIG. 10, a generalized block diagram of one embodiment of a top view of layout 1000 for a protection circuit is shown. Materials and dopants described earlier are numbered identically for layout 1000. In various embodiments, layout 1000 is a top view of layout for an n-type ESD transistor. The drain terminal is connected to the two inner contacts 966 and the source terminal is connected to the four outer contacts 966. Two gate terminals are connected to one another. Three dummy transistor gate stripes are formed to satisfy density rules in the fabrication of the integrated circuit utilizing Fin field effect transistors (Finfets). In various embodiments, the dummy transistor gate stripes are left floating.

In the illustrated embodiment, n-type wells 1002 are placed underneath the two outer contacts of the four source contacts. Typically, an n-type well is used for creating an environment for p-type regions for building p-type transistors. However, here, n-type wells 1002 are used for an n-type transistor. The n-type wells 1002 are not used for the drain terminal, which still uses n-type diffusion regions. As shown, the n-type wells 1002 are used only for part of the source terminal.

As described earlier, a parasitic bipolar NPN transistor exists within an n-type ESD transistor. The emitter terminal of the parasitic bipolar NPN transistor is at the source terminal of the ESD transistor. With the n-type wells 1002 at the source terminal of the ESD transistor, the size of the emitter terminal of the intrinsic bipolar NPN transistor appreciable grows and it is able to conduct more current.

Figure 11:
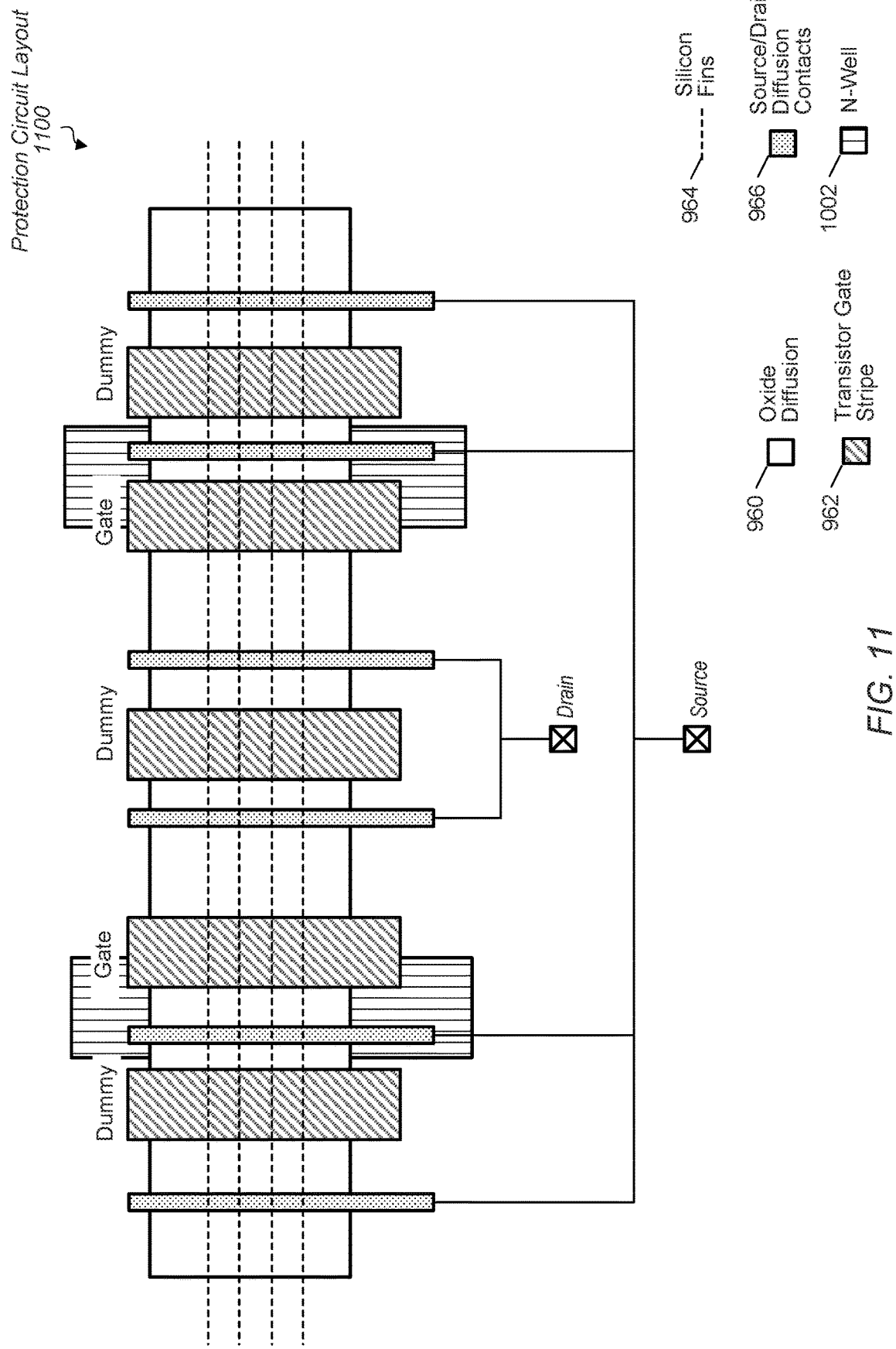
FIG. 11 is a block diagram of one embodiment of a top view of layout for a protection circuit.
Figure 12:
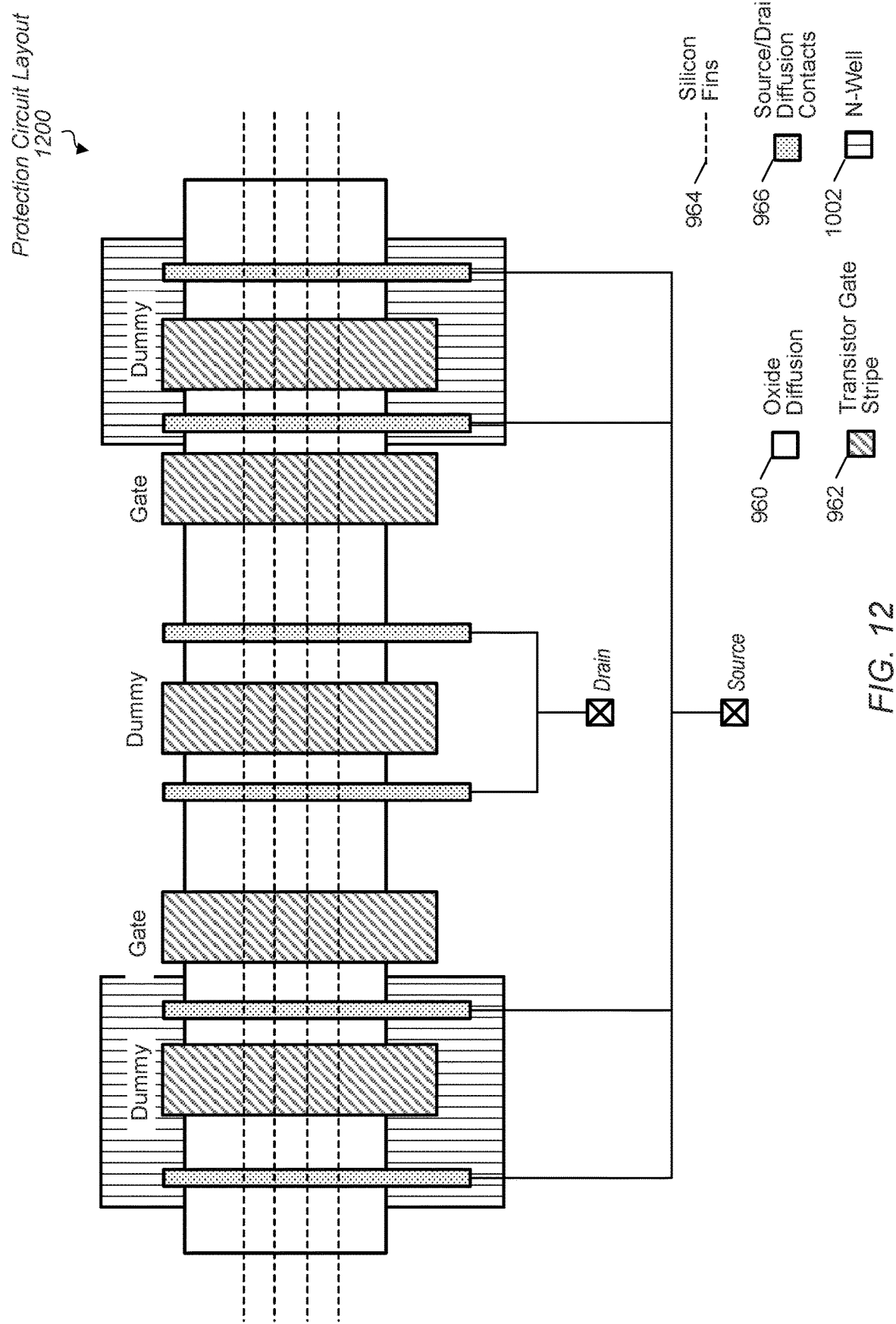
FIG. 12 is a block diagram of one embodiment of a top view of layout for a protection circuit.

Referring to FIGS. 11-12, generalized block diagrams of other embodiments of a top view of layout 1100 and layout 1200 for a protection circuit is shown. Materials and dopants described earlier are numbered identically. As described earlier, an n-well placed at the source terminal of an n-type ESD transistor increases the size of the emitter terminal of the intrinsic bipolar NPN transistor within the ESD transistor. The amount of increase in current conduction can change based on where the n-well is formed with respect to the other components of the ESD transistor. As described earlier, in one embodiment, the n-well is placed underneath the two outer source contacts of four source contacts used in the ESD transistor. As shown in layout 1100, the n-well 1002 is placed under the inner two source contacts of four source contacts used in the ESD transistor. As shown in layout 1200, the n-well 1002 is placed under each of the four source contacts used in the ESD transistor. The amount of conducting current during an ESD event may depend on the fabrication process used in addition to the topologies such as the topologies shown in FIGS. 10-12.

Figure 13:
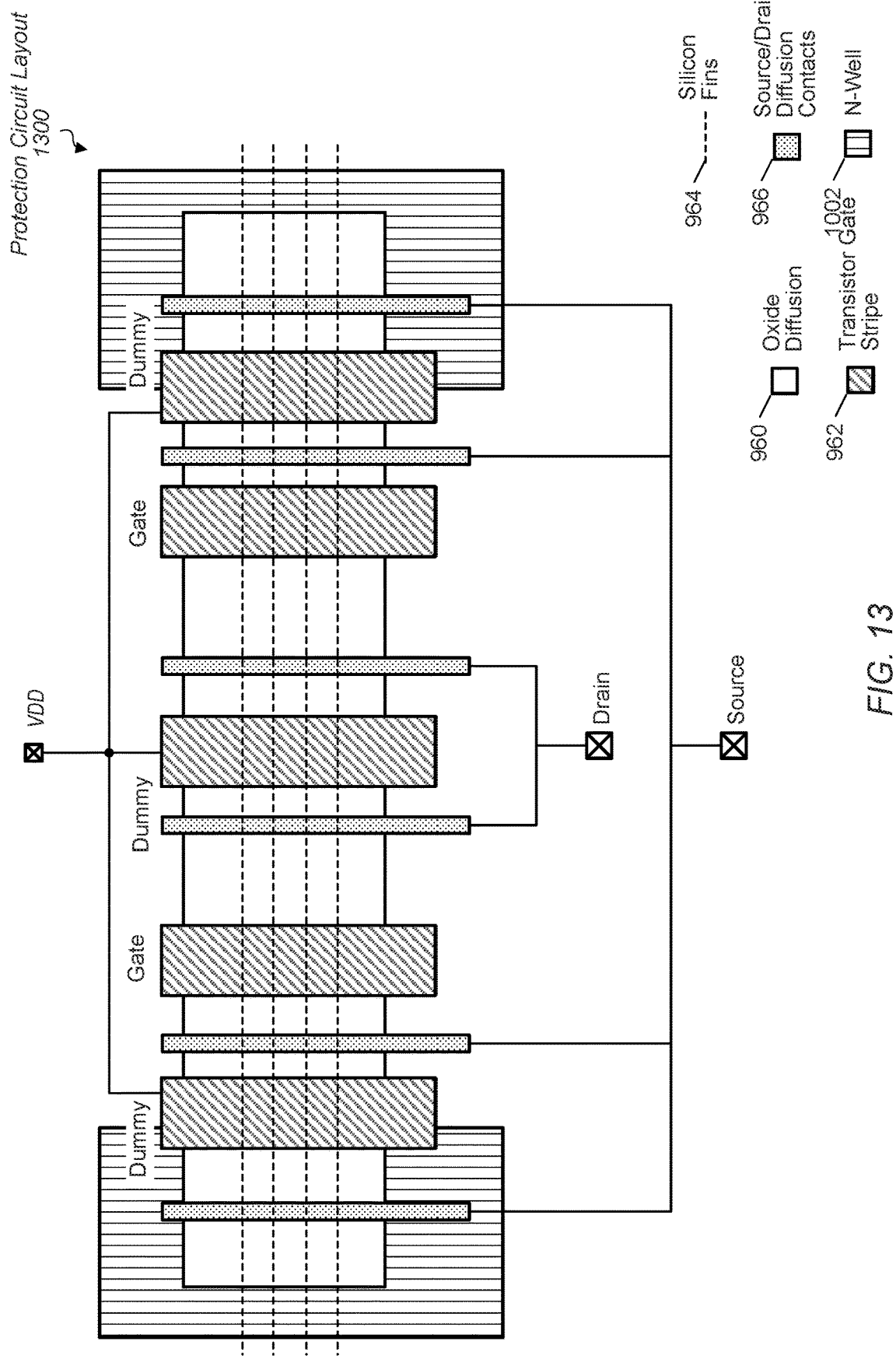
FIG. 13 is a block diagram of one embodiment of a top view of layout for a protection circuit.

Referring to FIG. 13, a generalized block diagram of another embodiments of a top view of layout 1300 for a protection circuit is shown. Materials and dopants described earlier are numbered identically. As shown, each of the previously floating dummy transistor gate stripes is now connected to the power supply labeled as "VDD." These connections increase the decoupling capacitance between power rails for the n-type ESD transistor. In addition, in some embodiments, the lengths of the dummy transistor gate stripes is increased to further increase the decoupling capacitance. The added decoupling capacitance does not reduce the amount of current conducted during an ESD event.

Figure 14:
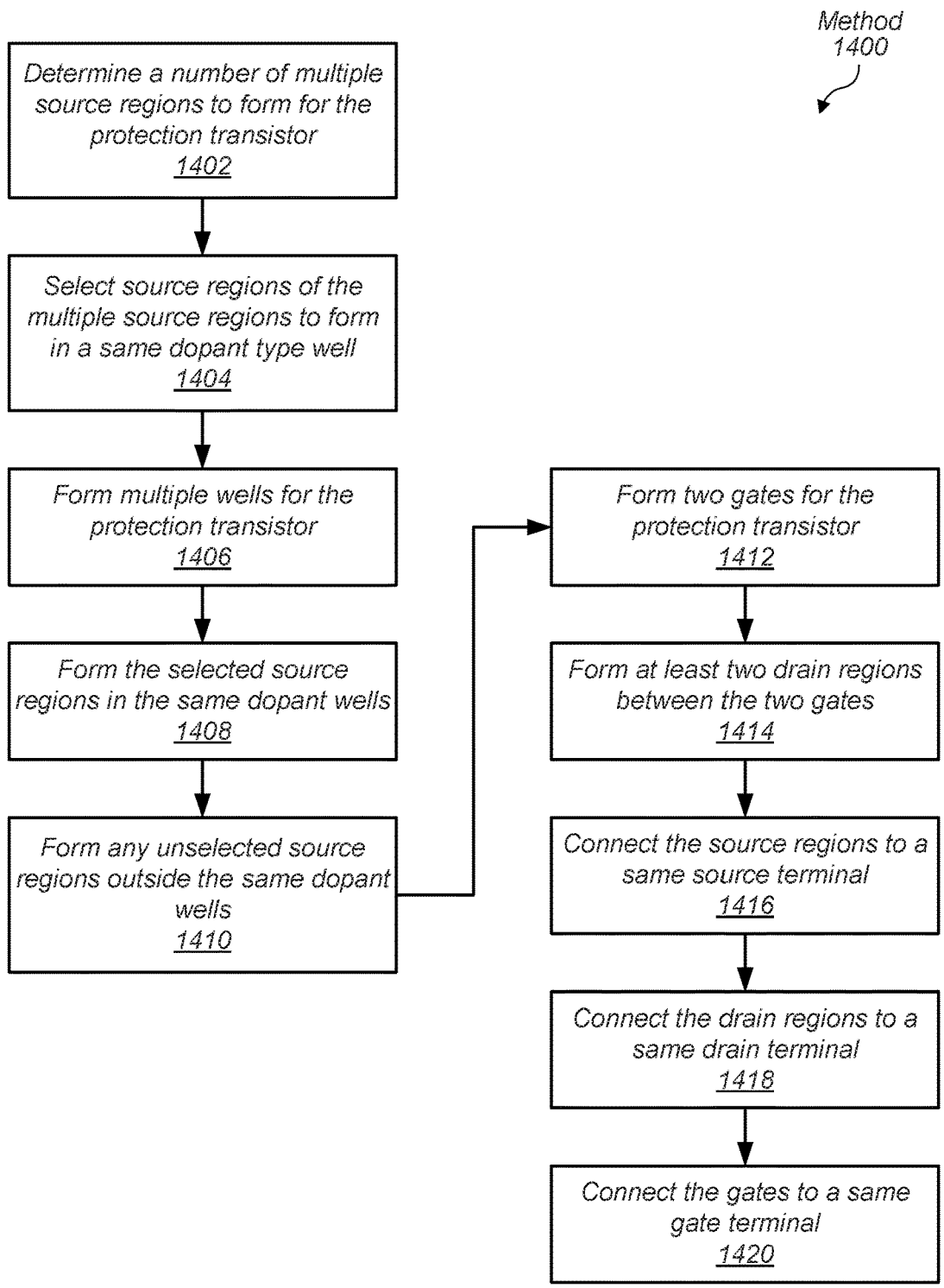
FIG. 14 is a flow diagram of one embodiment of a method for efficiently changing both tap cell characteristics and decoupling characteristics of floorplan partitions.

Referring now to FIG. 14, a generalized flow diagram of one embodiment of a method 1400 for efficiently improving the current conduction of a protection transistor is shown. In various embodiments, the protection transistor is an n-type ESD transistor with a drain terminal connected to an I/O signal and each of the gate terminal and the source terminal connected to a ground reference. A number of multiple source regions to form for the protection transistor is determined (block 1402). For example, as shown earlier, four source regions may be used in one embodiment. Source regions of the multiple source regions are selected to form in a same dopant type well (block 1404). For example, the outer source regions may be selected. Alternatively, the inner source regions may be selected. In other examples, all of the source regions are selected.

Multiple wells for the protection transistor are formed (block 1406). In various embodiments, two n-type wells are formed for an n-type ESD transistor. The selected source regions are formed in the same dopant wells (block 1408). Any unselected source regions are formed outside the same dopant wells (block 1410). Two gates for the protection transistor are formed (block 1412). For example, two transistor gate stripes are formed as described earlier. At least two drain regions are formed between the two gates (block 1414). In some embodiments, multiple dummy transistor gate stripes are formed to satisfy density rules in the fabrication of the integrated circuit with Fin field effect transistors (Finfets). Therefore, the at least two drain regions are formed on either side of a dummy transistor gate stripe between two other transistor gate stripes used for the gate connections.

The source regions are connected to a same source terminal (block 1416). The drain regions are connected to a same drain terminal (block 1418). The gate transistor gate stripes are connected to a same gate terminal (block 1420). As described earlier, the drain terminal is connected to an I/O signal and each of the gate terminal and the source terminal is connected to a ground reference. In some embodiments, each of the dummy transistor gate stripes is connected to the power supply, rather than left floating, in order to increase the decoupling capacitance of the protection transistor.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An integrated circuit comprising:
one or more electrostatic discharge (ESD) transistors, each comprising:
two transistor gate stripes connected to a same gate terminal; and
a plurality of source regions outside an area between the two transistor gate stripes, each source region connected through a contact to a same source terminal;
wherein a first source region of the plurality of source regions is formed in a well that has a same doping polarity as the first source region; and
wherein a given ESD transistor of the one or more ESD transistors is configured to conduct a current to the plurality of source regions of the given ESD transistor, including the first source region, responsive to detecting a charge on an I/O pin.

2. The integrated circuit as recited in claim 1, wherein at least a second source region of the plurality of source regions is formed in an area outside of the well.

3. The integrated circuit as recited in claim 1, wherein one of the one or more ESD transistors further comprises two drain regions between the two transistor gate stripes connected through contacts to a same drain terminal that is connected to the I/O pin.

4. The integrated circuit as recited in claim 1, wherein each of the same gate terminal and the same source terminal is connected to a given terminal.

5. The integrated circuit as recited in claim 3, wherein the two drain regions are formed in an area outside of the well.

6. The integrated circuit as recited in claim 1, wherein the given ESD transistor conducts current through a parasitic bipolar transistor from the I/O pin to the plurality of source regions including the first source region.

7. The integrated circuit as recited in claim 1, wherein:
one of the one or more ESD transistors further comprises a plurality of dummy transistor gate stripes; and
one or more of the plurality of dummy transistor gate stripes is connected to a power supply to increase decoupling capacitance.

8. A method for semiconductor fabrication comprising:
forming two transistor gate stripes of an electrostatic discharge (ESD) transistor;
connecting the two transistor gate stripes to a same gate terminal;
forming a plurality of source regions of the ESD transistor outside an area between the two transistor gate stripes;
connecting the plurality of source regions through a contact to a same source terminal; and
forming a first source region of the plurality of source regions in a well that has a same doping polarity as the first source region; and
conducting, by a given ESD transistor of the one or more ESD transistors, a current to the plurality of source regions of the given ESD transistor, including the first source region, responsive to detecting a charge on an I/O pin.

9. The method as recited in claim 8, further comprising forming at least a second source region of the plurality of source regions in an area outside of the well.

10. The method as recited in claim 8, further comprising forming two drain regions of the ESD transistor between the two transistor gate stripes connected through contacts to a same drain terminal that is connected to the I/O pin.

11. The method as recited in claim 10, further comprising connecting each of the same gate terminal and the same source terminal to a given terminal.

12. The method as recited in claim 10, further comprising forming the two drain regions in an area outside of the well.

13. The method as recited in claim 8, further comprising conducting current, by the given ESD transistor, through a parasitic bipolar transistor from the I/O pin to the plurality of source regions including the first source region.

14. The method as recited in claim 8, further comprising:
forming a plurality of dummy transistor gate stripes of the ESD transistor; and
connecting one or more of the plurality of dummy transistor gate stripes to a power supply to increase decoupling capacitance.

* * * * *